(12) United States Patent
Mala et al.

(10) Patent No.: US 7,095,546 B2
(45) Date of Patent: Aug. 22, 2006

(54) MICRO-ELECTRO-MECHANICAL-SYSTEM TWO DIMENSIONAL MIRROR WITH ARTICULATED SUSPENSION STRUCTURES FOR HIGH FILL FACTOR ARRAYS

(75) Inventors: Mohiuddin Mala, Kanata (CA); Thomas Ducellier, Ottawa (CA); Alan Hnatiw, Stittsville (CA); David Peale, San Diego, CA (US)

(73) Assignee: Metconnex Canada Inc., Ottawa (CA)

( * ) Notice: Subject to any disclaimer, the term of this patent is extended or adjusted under 35 U.S.C. 154(b) by 98 days.

(21) Appl. No.: 10/827,252

(22) Filed: Apr. 20, 2004

(65) Prior Publication Data

US 2004/0212907 A1 Oct. 28, 2004

Related U.S. Application Data

(60) Provisional application No. 60/464,972, filed on Apr. 24, 2003.

(51) Int. Cl.
*G02B 26/00* (2006.01)
*G02B 26/08* (2006.01)
*G02B 7/182* (2006.01)

(52) U.S. Cl. .................. 359/290; 359/224; 359/874
(58) Field of Classification Search ................ 359/224, 359/225, 290, 291, 295, 298, 874
See application file for complete search history.

(56) References Cited

U.S. PATENT DOCUMENTS

| | | | |
|---|---|---|---|
| 4,317,611 A | 3/1982 | Petersen | |
| 4,662,746 A | 5/1987 | Hornbeck | .............. 350/269 |
| 4,710,732 A | 12/1987 | Hornbeck | .............. 332/7.51 |
| 4,956,619 A | 9/1990 | Hornbeck | .............. 330/4.3 |
| 5,061,049 A | 10/1991 | Hornbeck | .............. 359/224 |
| 5,079,545 A | 1/1992 | Priem et al. | .............. 340/747 |
| 5,083,857 A | 1/1992 | Hornbeck | .............. 359/291 |
| 5,105,369 A | 4/1992 | Nelson | .............. 364/525 |
| 5,172,262 A | 12/1992 | Hornbeck | .............. 359/223 |
| 5,278,652 A | 1/1994 | Urbanus et al. | .............. 358/160 |
| 5,469,302 A | 11/1995 | Lim | .............. 359/846 |
| 5,535,047 A | 7/1996 | Hornbeck | .............. 359/295 |
| 5,543,956 A | 8/1996 | Nakagawa et al. | |
| 5,579,148 A | 11/1996 | Nishikawa et al. | |
| 5,629,790 A | 5/1997 | Neukermans et al. | |

(Continued)

FOREIGN PATENT DOCUMENTS

CA 2429508 11/2003

(Continued)

OTHER PUBLICATIONS

Thor Juneau, et al.; Single-Chip 1×84 MEMS Mirror Array for Optical Telecommunication Applications; Proceedings of SPIE, MOEMS and Miniaturized Systems III, Jan. 27-29, 2003, vol. 4983, pp. 53-64.

(Continued)

*Primary Examiner*—Ricky Mack
*Assistant Examiner*—William Choi

(57) ABSTRACT

The invention provides a micro-electro-mechanical-system (MEMS) mirror device, comprising: a mirror having a 2-dimensional rotational articulated hinge at a first end, and having a 1-dimensional rotational articulated hinge at a second end opposite the first end; a movable cantilever connected to the mirror through the 1-dimensional rotational articulated hinge; a support structure connected to the mirror through the 2-dimensional rotational articulated hinge and connected to the movable cantilever; whereby movement of said movable cantilever causes rotation of the mirror in a first axis of rotation, and the mirror is also rotatable about a second torsional axis of rotation perpendicular to said first axis of rotation.

29 Claims, 8 Drawing Sheets

U.S. PATENT DOCUMENTS

| | | | |
|---|---|---|---|
| 5,661,591 A | 8/1997 | Lin et al. ............... | 359/290 |
| 5,920,417 A | 7/1999 | Johnson | |
| 6,044,705 A | 4/2000 | Neukermans et al. | |
| 6,198,565 B1 | 3/2001 | Iseki et al. | |
| 6,201,629 B1 | 3/2001 | McClelland et al. ........ | 359/223 |
| 6,259,548 B1 | 7/2001 | Tsugai et al. | |
| 6,315,423 B1 | 11/2001 | Yu et al. | |
| 6,392,220 B1 | 5/2002 | Slater et al. | |
| 6,431,714 B1* | 8/2002 | Sawada et al. ............. | 359/879 |
| 6,454,421 B1 | 9/2002 | Yu et al. | |
| 6,480,320 B1 | 11/2002 | Nasiri ......................... | 359/291 |
| 6,495,893 B1* | 12/2002 | Lin et al. .................... | 257/415 |
| 6,533,947 B1 | 3/2003 | Nasiri et al. | |
| 6,538,799 B1 | 3/2003 | McClelland et al. | |
| 6,597,828 B1 | 7/2003 | Lee et al. | |
| 6,690,850 B1 | 2/2004 | Greywall | |
| 6,747,786 B1 | 6/2004 | Murakami et al. | |
| 6,760,144 B1 | 7/2004 | Hill et al. | |
| 6,778,728 B1 | 8/2004 | Taylor et al. | |
| 6,781,744 B1 | 8/2004 | Aksyuk et al. | |
| 6,822,370 B1 | 11/2004 | Clark et al. | |
| 6,984,917 B1 | 1/2006 | Greywall et al. | |
| 2002/0012180 A1 | 1/2002 | Yu et al. | |
| 2002/0071169 A1 | 6/2002 | Bowers et al. ............. | 359/291 |
| 2002/0075554 A1 | 6/2002 | Brophy et al. ............. | 359/291 |
| 2004/0212864 A1 | 10/2004 | Greywall et al. | |

FOREIGN PATENT DOCUMENTS

| | | |
|---|---|---|
| EP | 0902538 | 9/1998 |
| EP | 1197779 | 10/2001 |

OTHER PUBLICATIONS

SOI MUMPS (http://www.memsrus.com/figs/soimumps.pdf) from Cronos (MEMScAP subsidiary).

Optical Networking, The Analog Devices Solutions Bulletin, Jan. 2002, Analog Devices at OFC 2002, Anaheim, CA, Booth 4975, Mar. 19-21.

IEEE Communications Magazine, Mar. 2002, vol. 40, No. 3.

Bergman, K., et al.; Micromachines for Optical-Layer Networking: What is their value and when will they deliver? Tellium. Contact: Evango@ieee.org, no date.

Lopez, D., et al.; Monolithic MEMS Optical Switch with Amplified Out-of-Plane Angular Motion; IEEE, 2002, pp. 165-166.

Garcia, Ernest J.; Pivoting Micromirror Designs for Large Orientation Angles; Proceedings SPIE 4178, pp. 126-136.

Kehr, Kersten, et al.; Analogously Working Micromirror Arrays; Part of the SPIE Conference on Miniaturized Systems with Micro-Optics and MEMS, Santa Clara, Sep. 1999, SPIE vol. 3878, pp. 80-89.

Giles, C.R. et al.; A Silicon MEMS Optical Switch Attenuator and Its Use in Lightwave Subsystems; IEEE Journal of Selected Topics in Quantum Electronics, vol. 5, No. 1, Jan./Feb. 1999, pp. 18-25.

Johanna I. Young, et al.; Comparative Study of 2-DOF Micromirrors for Precision Light Manipulation Spie Smart Structures and Materials Conference, Newport Beach, CA, Mar. 4-7, 2001.

Velijko Milanovic, et al.l Monolithic High Aspect Ratio Two-Axis Optical Scanners in SOI; 2003 Mems Conference, Kyoto, Japan, Jan. 19-23, 2003, pp. 255-258.

Sunghoon Kwon, et al.; Large-Displacement Vertical Microlens Scanner With Low Driving Voltage; IEEE Photonics Technology Letters, vol. 14, No. 11, Nov. 2002, pp. 1572-1574.

Horsley et al., Multi-Degree of Freedom Dynamic Characterization of Deep-Etched Silicon Suspensions; Solid State Sensor and Actuator Workshop, Hilton Head, Jun. 4-8, 2000, pp. 81-84.

B.M. Evans et al.; Finite Element Modeling of Micromachined Mems Photon Devices; Miniaturized Systems with Micro-optics and MEMIS, Santa Clara, Sep. 1999, SPIE 3878, pp. 253-260.

David Burns, et al.; Optical Bea, Steering Using Surface Micromachined Gratings and Optical Phased Arrays; Optical Scanning Systems; Design and Application, San Diego, CA, Jul. 1997, SPIE 3131, pp. 99-110.

* cited by examiner

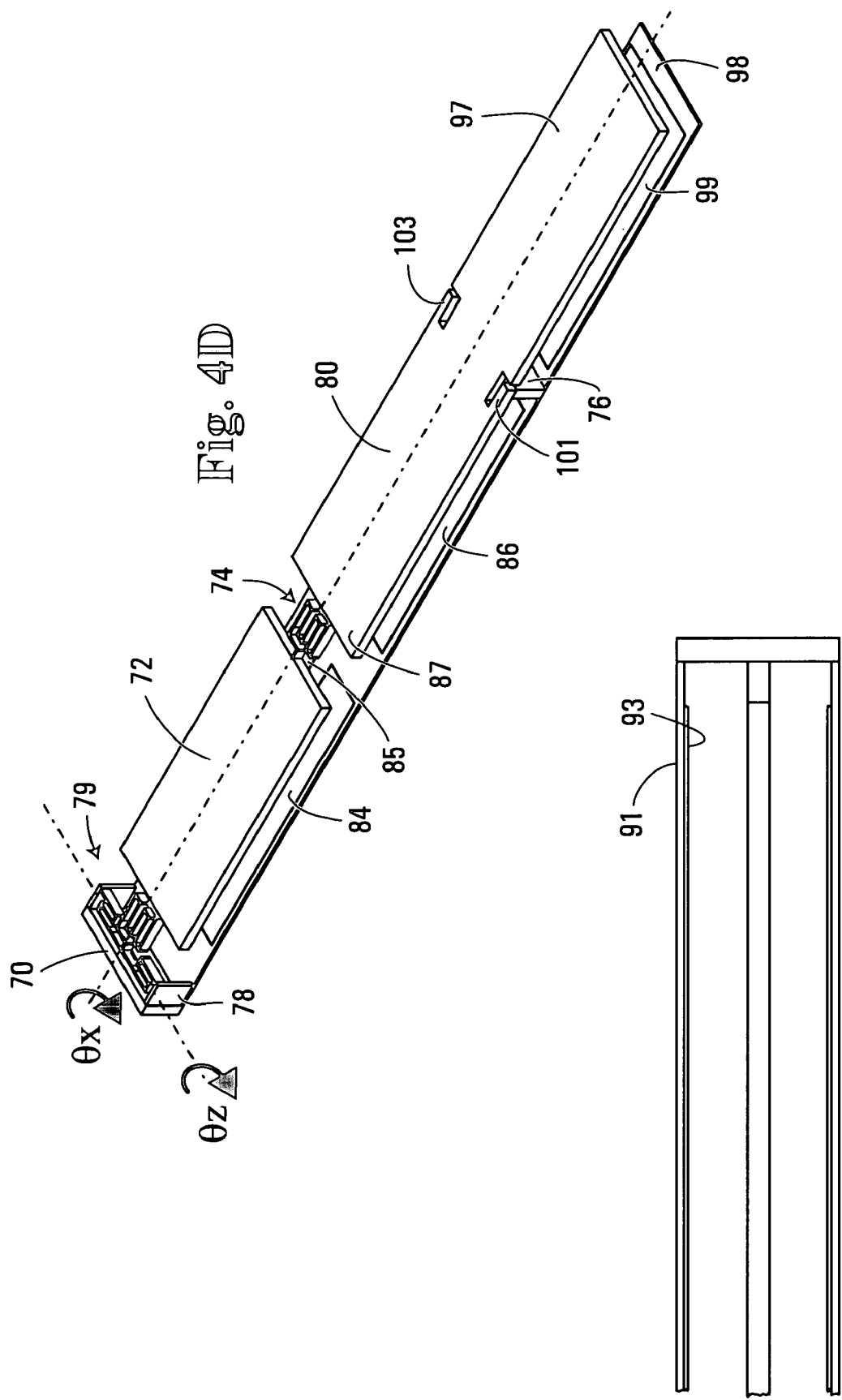

MICRO-ELECTRO-MECHANICAL-SYSTEM TWO DIMENSIONAL MIRROR WITH ARTICULATED SUSPENSION STRUCTURES FOR HIGH FILL FACTOR ARRAYS

RELATED APPLICATION

This application claims the benefit of prior U.S. provisional application No. 60/464,972 filed Apr. 24, 2003.

FIELD OF THE INVENTION

The invention relates to a MEMS (micro-electro-mechanical-system) two dimensional mirror with articulated suspension structures for high fill factor arrays.

BACKGROUND OF THE INVENTION

A MEMS (Micro-Electro-Mechanical-System) device is a micro-sized mechanical structure having electrical circuitry fabricated together with the device by various microfabrication processes mostly derived from integrated circuit fabrication methods. The developments in the field of microelectromechanical systems (MEMS) allow for the bulk production of microelectromechanical mirrors and mirror arrays that can be used in all-optical cross connect switches, 1×N, N×N optical switches, attenuators etc. A number of microelectromechanical mirror arrays have already been built using MEMS production processes and techniques. These arrays have designs that fall into approximately three design categories.

A first category consists of conventional 2D gimbal mirrors with each mirror surrounded by a frame. The conventional 2D gimbal mirror is one of the most common types of MEMS 2D micromirrors. An example is shown in FIG. 6. It consists of a central mirror 10 that is connected to an outer frame 12 with torsional hinges 14. The outer frame 12 is in turn connected to the support structure 16 with another set of torsional hinges 18. There are four electrodes under the central mirror 10 that can be actuated resulting in a 2D tilt of the mirror-frame assembly. One such device is disclosed under U.S. Patent Application Publication No.: US2002/0071169 A1, publication date Jun. 13, 2002. One of the shortcomings of this design is the inability to achieve high fill factors (that is the spacing between two consecutive mirrors or the ratio of the active area to the total area in an array) in a mirror array. An example of a high fill factor would be >90% active mirror portion along one dimension.

A second category consists of 2D/3D mirrors with hidden hinge structures. With significant advances made in Spatial Light Modulators, a number of 2D micromirror devices have been designed with various types of hidden hinge structure. Examples of these are disclosed in U.S. Pat. No. 5,535,047, U.S. Pat. No. 5,661,591, U.S. Pat. No. 6,480,320 B2.

A schematic of an example of such a device is shown in FIG. 7. Although this device structure can yield high fill factor arrays, the fabrication processes are very complex. For more discussion on the Spatial Light Modulators and Digital Mirror devices with hidden hinge structure, references are made to U.S. Pat. No. 5,061,049, U.S. Pat. No. 5,079,545, U.S. Pat. No. 5,105,369, U.S. Pat. No. 5,278,652, U.S. Pat. No. 4,662,746, U.S. Pat. No. 4,710,732, U.S. Pat. No. 4,956,619, U.S. Pat. No. 5,172,262, and U.S. Pat. No. 5,083,857.

A third category consists of 2D mirrors each mounted on a single moving flexible post. An example of a MEMS tilt platform supported by a flexible post 30 as shown in FIG. 8. The post 30 extends within a moat 32 or trench formed in the substrate or supporting material 34. The post 30 can be made sufficiently long and flexible to act as an omnidirectional hinge, bending to allow the mirror 36 to be positioned with two degrees of freedom.

Some of the shortcomings of this design are process complexity, post flexibility, wiring, and tilt eccentricity. A few of such devices have been disclosed in U.S. Pat. No. 5,469,302, US Patent Application Publication No. US 2002/0075554 A1. Furthermore, the control for these devices becomes complex and is a substantial part of the device cost.

SUMMARY OF THE INVENTION

Some of the advantages realized in some but not necessarily all embodiments include:

high fill factor linear arrays. Fill factors as high as 99% may be achieved in some embodiments along one dimension;

almost negligible coupling between two tilt axes;

inexpensive and simple control. Even an open loop/look up table control is a possibility;

simple fabrication process can be used to fabricate the device; and the cantilever part of the device can also be used for capacitive, magnetic or optical sensing of mirror position.

According to one broad aspect, the invention provides a micro-electro-mechanical-system (MEMS) mirror device, comprising: a mirror having a 2-dimensional rotational articulated hinge at a first end, and having a 1-dimensional rotational articulated hinge at a second end opposite the first end; a movable cantilever connected to the mirror through the 1-dimensional rotational articulated hinge; a support structure connected to the mirror through the 2-dimensional rotational articulated hinge and connected to the movable cantilever; whereby movement of said movable cantilever causes rotation of the mirror in a first axis of rotation, and the mirror is also rotatable about a second torsional axis of rotation perpendicular to said first axis of rotation.

In some embodiments, the 2-dimensional rotational articulated hinge comprises: a first 1-dimensional rotational articulated hinge having a first mounting point at a first end and having a second end; a second 1-dimensional rotational articulated hinge having a second mounting point at a first end and having a second end, the second end of the first 1-dimensional rotational articulated hinge being connected to the second end of the second 1-dimensional rotational articulated hinge; a third 1-dimensional rotational articulated hinge connected to the second ends of the first and second articulated 1-dimensional rotational hinges; whereby the first 1-dimensional rotational articulated hinge and the second 1-dimensional rotational articulated hinge define the first axis of rotation between the first and second mounting points, and the third 1-dimensional rotational articulated hinge and the 1-dimensional rotational articulated hinge at the second end of the mirror define the second torsional axis of rotation perpendicular to the first axis of rotation.

In some embodiments, each 1-dimensional rotational articulated hinge comprises a respective articulated beam having a large thickness to width aspect ratio.

In some embodiments, each 1-dimensional rotational articulated hinge comprises a respective articulated beam having a large thickness to width aspect ratio, the beam being formed of a material or materials selected from a group consisting of silicon, polysilicon, Silicon Nitride, Silicon dioxide, and metallic depositable materials.

In some embodiments, the beams are formed of a unitary construction.

In some embodiments, the beams, the mirror, and the movable cantilever are formed of a unitary construction.

In some embodiments, a device is provided in which the mirror has an angular range of motion at least 0.3 degrees in each axes.

In some embodiments, the device further comprises electrodes for applying electrostatic force to the mirror so as to move the mirror in the first and second axes of rotation.

In some embodiments, the electrodes comprise two electrodes each for applying a respective electrostatic force to the mirror so as to move the mirror in a respective direction in the second axis of rotation, and at least one electrode for applying electrostatic force to the movable cantilever so as to move the mirror in the first rotational axis.

In some embodiments, said at least one electrode comprises two electrodes mounted on the support structure each for applying a respective electrostatic force to the moving cantilever so as to move the mirror in a respective direction in the first rotational axis.

In some embodiments, said support structure comprises a first region on a first side of the movable cantilever to which is mounted a first of said two electrodes for applying electrostatic force to the movable cantilever, and a second region opposite the moving cantilever to the first region to which is mounted a second of said two electrodes for applying electrostatic force to the movable cantilever.

In some embodiments, the device further comprises: a rigid extension of the movable cantilever extending beyond where the support structure is connected to the movable cantilever in a direction opposite to the mirror; whereby movement of the extension of the movable cantilever causes a corresponding opposite movement of the movable cantilever.

In some embodiments, the device comprises a first electrode for applying electrostatic force to the mirror so as to move the mirror in a first direction in the first axis of rotation, and a second electrode for applying electrostatic force to the mirror so as to move the mirror in a second direction in the first axis of rotation.

In some embodiments, the first electrode for applying electrostatic force to the mirror so as to move the mirror in a first direction in the first axis of rotation is on the support structure proximal the moving cantilever, and the second electrode for applying electrostatic force to the mirror so as to move the mirror in a second direction in the first axis of rotation is on the support structure proximal the extension of the moving cantilever.

In some embodiments, the moving cantilever and the rigid extension of the moving cantilever are together pivotably mounted to the support structure.

In some embodiments, the moving cantilever and the rigid extension of the moving cantilever are together rigidly mounted to a portion of the support structure which is sufficiently flexible to allow the moving cantilever and the rigid extension of the moving cantilever to rotate in the first axis of rotation.

In some embodiments, moments of inertia of the rigid extension of the moving cantilever substantially balance moments of inertia of the moving cantilever and mirror.

In some embodiments, the device in which the mirror is made of silicon plated with a metal.

In some embodiments, the metal comprises Au, Al or Cu layers.

In some embodiments, the plurality N of devices is arranged side by side to form a 1×N MEMs array, where $N \geq 2$.

In some embodiments, the plurality N×M of devices is arranged in N rows of M devices thereby forming an N×M MEMs array, where $N \geq 2$ and $M \geq 2$.

In another embodiment, the mirror is used for optical switching and the movable cantilever is used for capacitive, magnetic or optical sensing of mirror position.

According to another broad aspect, the invention provides an optical switch comprising: a plurality of optical ports; a plurality of devices each adapts to switch light between a respective pair of said optical ports.

According to another broad aspect, the invention provides a 2-dimensional rotational articulated hinge for connection to a support structure and a device to be rotated, the hinge comprising: a first 1-dimensional rotational articulated hinge having a first mounting point at a first end and having a second end; a second 1-dimensional rotational articulated hinge having a second mounting point at a first end and having a second end, the second end of the first 1-dimensional rotational articulated hinge being connected to the second end of the second 1-dimensional rotational articulated hinge; a third 1-dimensional rotational articulated hinge having a first end connected to the second ends of the first and second articulated 1-dimensional rotational hinges and having a second end; whereby the first 1-dimensional rotational articulated hinge and the second 1-dimensional rotational articulated hinge define a first axis of rotation between the first and second mounting points, and the third 1-dimensional rotational articulated hinge defines a second torsional axis of rotation perpendicular to the first axis of rotation between the first end and second end of the third 1-dimensional rotational articulated hinge.

In some embodiments, each 1-dimensional rotational articulated hinge comprises a respective articulated beam having a high thickness to width aspect ratio.

In some embodiments, the beams are formed of a unitary construction.

In some embodiments, the beams are formed of a material or materials selected from a group consisting of silicon, polysilicon, Silicon Nitride, Silicon dioxide, and Metallic depositable materials.

BRIEF DESCRIPTION OF THE DRAWINGS

Preferred embodiments of the invention will now be described with reference to the attached drawings in which:

FIGS. 4B and 4C provide a cutaway and side sectional view of a mirror with a two dimensional rotational articulated hinge and moving cantilever mounting system provided by another embodiment of the invention;

FIG. 4D is a view of a mirror with a two dimensional rotational articulated hinge and moving cantilever mounting system provided by another embodiment of the invention;

DETAILED DESCRIPTION OF THE PREFERRED EMBODIMENTS

Figure 1A:
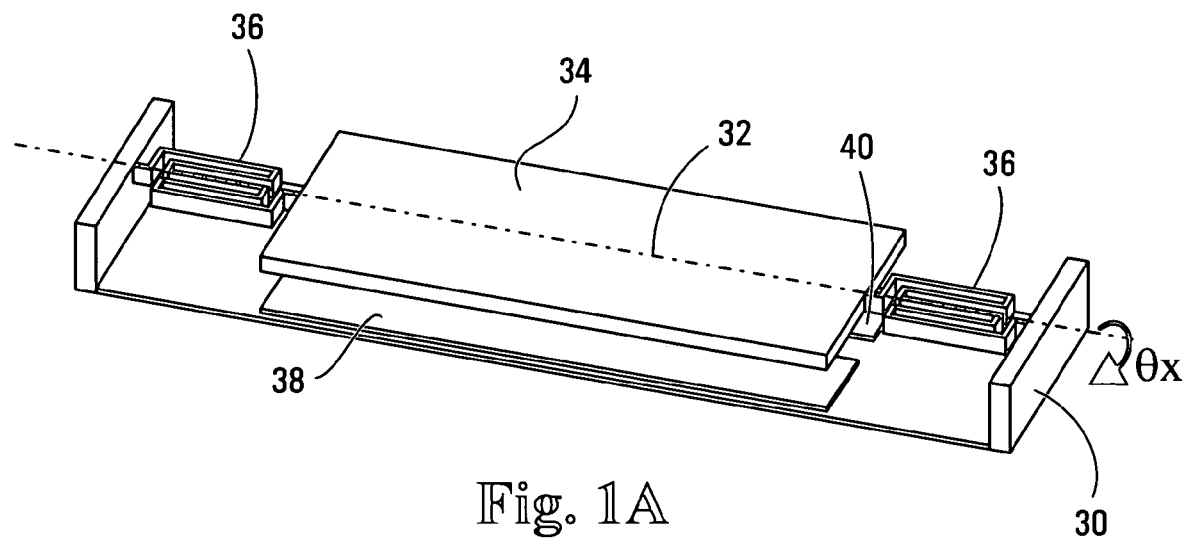
FIG. 1A and FIG. 1B provide two views of a conventional 1 dimensional MEMS mirror with an articulated suspension structure.
Figure 1B:
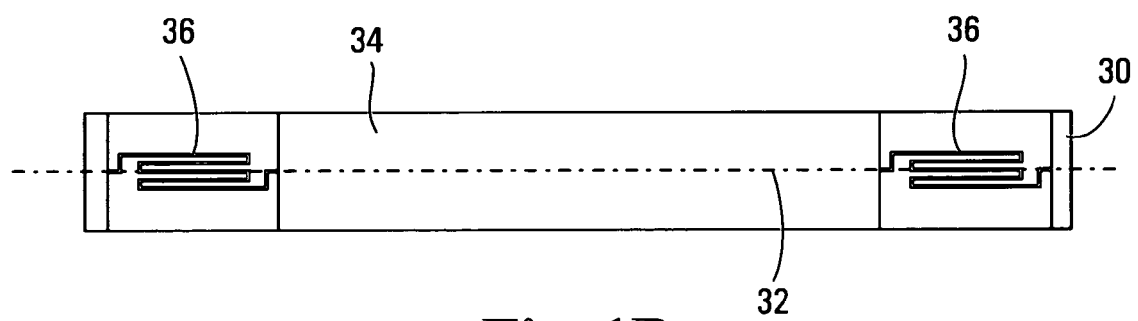
Figure 2A:
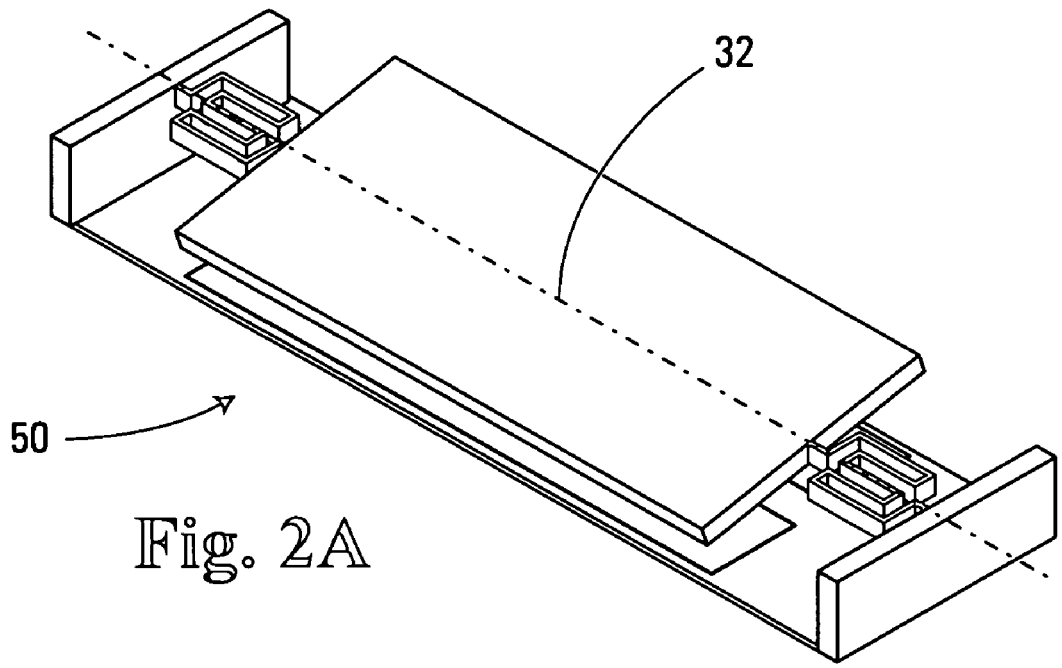
FIG. 2 shows the device of FIG. 1 in two rotational states.
Figure 2B:
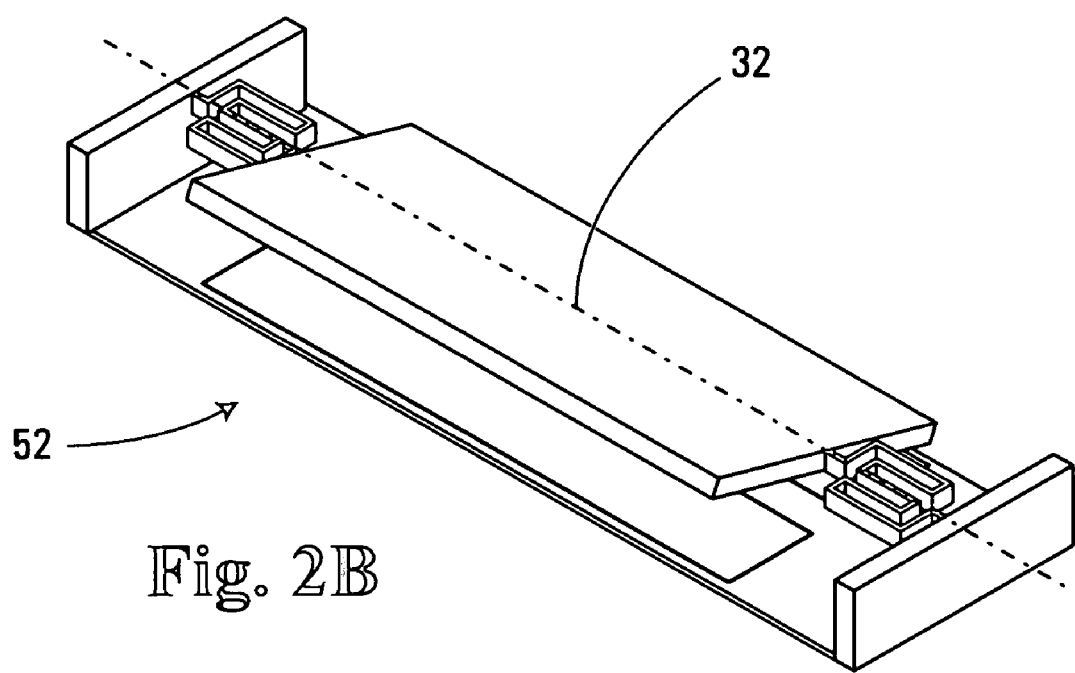

A known 1D MEMS torsional mirror supported by articulated suspension springs/hinges is shown in FIGS. 1A and 1B. This arrangement consists of a support structure 30 within which is mounted a mirror 34 connected to the support structure 30 through two articulated hinges 36. Typically, the entire mirror plus articulated hinges arrangement is made of a single piece of silicon. The articulated hinges 36 consist of a silicon beam with a high aspect ratio of length to width thereby allowing torsional rotation. Using articulation allows a long silicon beam to be provided in a very small space. Also shown are a pair of address electrodes 38 and 40. These would be connected to control systems capable of applying voltages to the electrode. Typically the mirror arrangement would be attached to ground. The mirror 34 can be rotated around its rotational axis (θx) 32 by applying electrostatic force on either side of the mirror using the electrodes 38,40. This is shown in FIG. 2. Generally indicated at 50 is the mirror in a first configuration where the mirror has been rotated counter clockwise about the rotational axis 32 and generally indicated at 52 shows the same arrangement in which the mirror has been rotated clockwise about the rotational axis 32.

Figure 3A:
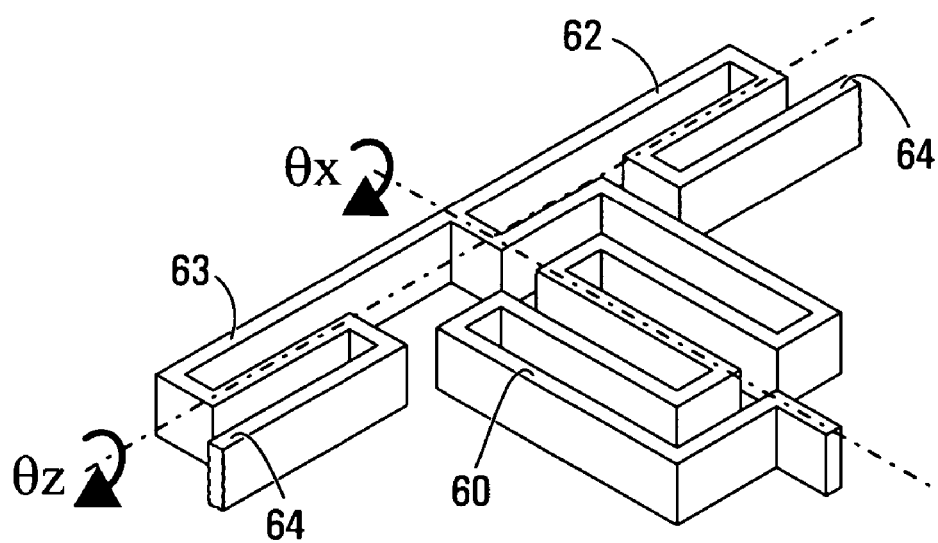
FIG. 3A is a plan view of a two dimensional articulated rotational hinge provided by an embodiment of the invention.

To facilitate 2D rotation of a mirror, that is rotation in both (θx) and (θz), θz being orthogonal to the main torsional tilt (θx), an embodiment of the invention provides a 2D rotatable articulated hinge. A top view of a new articulated hinge is shown in FIG. 3A. The 2D rotatable articulated hinge includes a first articulated hinge portion 60 and a pair of second articulated hinges 62,63. Each of the second articulated hinges 62,63 is connectable to a support structure indicated generally at 64 and is also connected to the first articulated hinge 60. Each of the three articulated hinges 60,62,63 is similar to the conventional articulated hinge 36 of FIG. 1A. Namely each articulated hinge consists of a silicon beam with high aspect ratio thickness to width. The entire arrangement consisting of the three articulated hinges 60,62,63 is preferably made from a single unitary piece of silicon. In other embodiments, the arrangement is made of a deposited material such as polysilicon, Silicon Nitride, Silicon dioxide, and Metallic depositable materials. Other materials may be employed. Preferably the construction is unitary in the sense that no assembly is required. However, the beams may be made of multiple materials, for example in a layered structure. The first articulated hinge 60 allows rotation along a first torsional axis (θx) while each of the second articulated hinges 62 and 63 allow rotation about a second axis (θz).

Figure 3B:
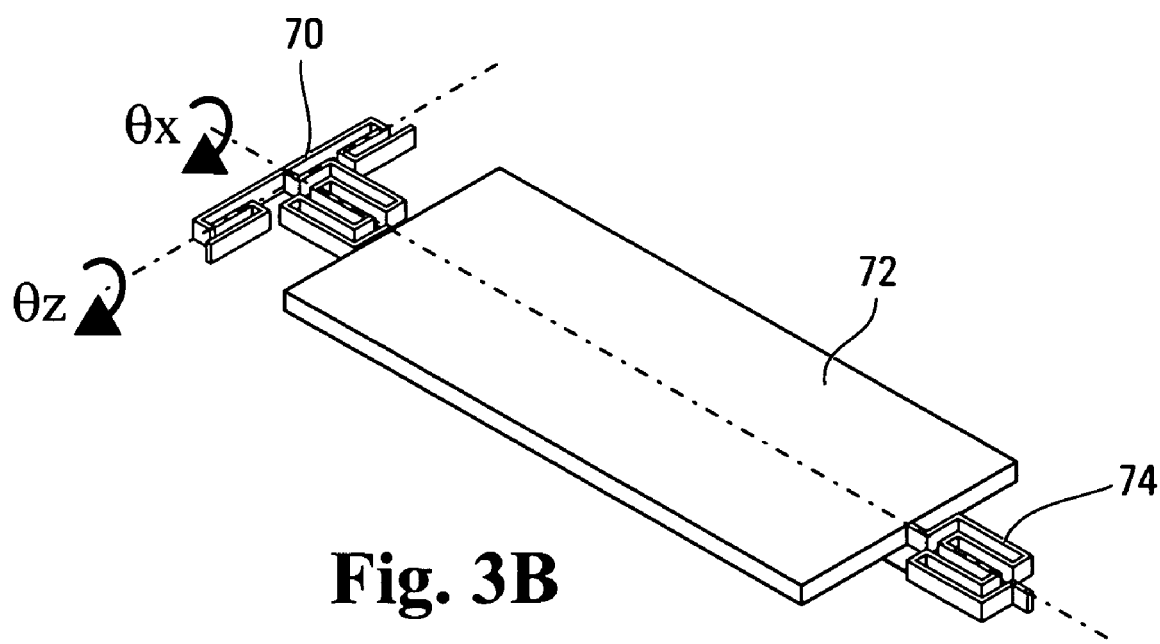
FIG. 3B illustrates a MEMS mirror featuring the two dimensional rotational articulated hinge of FIG. 3A.

Referring now to FIG. 3B, shown is a first example use of the articulated hinge of FIG. 3A. Here the articulated hinge is generally indicated by 70 and is connected to a mirror 72 at the opposite end of which there is another 1D articulated hinge 74. Preferably the entire arrangement of FIG. 3B is made from a single piece of silicon. The arrangement as shown in FIG. 3B allows the mirror 72 to rotate about the main rotational axis (θx) and the additional rotational axis (θz) which is orthogonal to the main rotational axis.

Figure 4A:
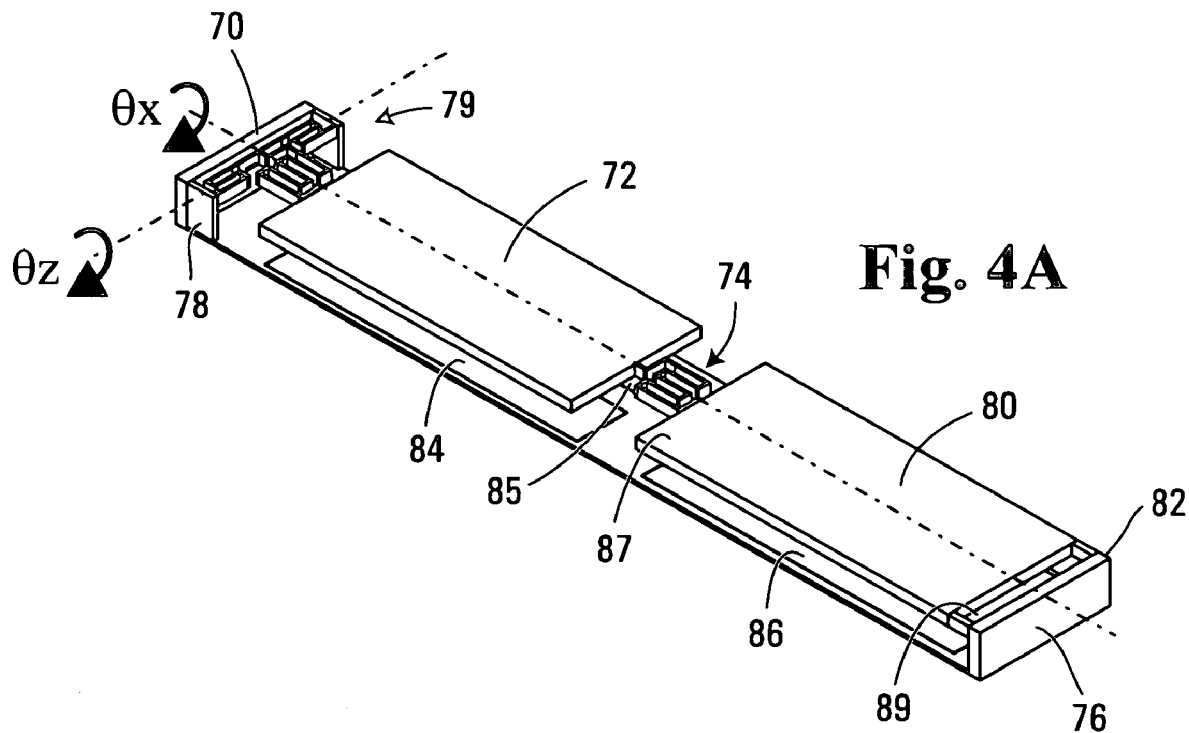
FIG. 4A is a view of a mirror with a two dimensional rotational articulated hinge and moving cantilever mounting system provided by an embodiment of the invention.

In a preferred embodiment of the invention, the arrangement of FIG. 3B is employed in an apparatus illustrated by way of example in FIG. 4A. Here, again the 2D rotation articulated hinge 70 is shown connected to the mirror 72 and 1D rotational articulated hinge 74. A support structure is generally indicated by 76. The 2D rotational articulated hinge 70 is connected in two places 78,79 to the support structure. The 1D rotational articulated hinge 74 is connected to the support structure 76 through a cantilever 80. The cantilever is preferably simply another piece of silicon which is connected to the support structure 76 at 82 in a manner which allows substantially no rotation of this cantilever about the main rotational axis (θx). However, the cantilever 80 does have some flexibility, and in particular, the end 87 of the cantilever 80 most remote from the connection 82 to the support structure is capable of some up and down motion. To allow additional flexibility of the cantilever 80, parts may be removed. In the illustrated example, the cantilever 80 includes a gap 89 near the mounting point 82 to support structure 76. This reduces the amount of force necessary to cause the up and down motion of point 87.

To control rotation in the torsional axis (θx), electrodes are provided 84,85 which operate similar to the electrodes through 38,40 of FIG. 1A. This allows the control of the rotation of the mirror 72 about the main torsional axis. Also shown is an electrode 86 beneath the cantilever structure 80 which controls the up and down motion of the end 87 of the cantilever 80 most remote from the connection 82 to the support structure 76. The up and down motion of this point 87 causes rotation of the mirror 72 about the additional rotational axis (θz), thus making the mirror tilt in both axes either simultaneously or independently.

Any suitable dimensions for the articulated hinges may be employed. Different numbers of articulations can be employed. The more articulations included in a given articulated hinge, the less will be the required force to cause rotation about the respective axis. In an example implementation, the dimensions of the various hinges are as follows:

Hinge 62 and 63: {75 um (L), 1.5 um (W), 15 um (T), 5 um (Gap) and 3 (articulations)};

Hinge 60 and 74: {75 um (L), 1.5 um (W), 15 um (T), 5 um (Gap) and 11 (articulations)}

In preferred embodiments, both for the embodiment of FIG. 4A and subsequently described embodiments, some or all of the entire structure used to make the mirror, cantilevers and articulated hinges is connected to ground, and behaves like an electrode. For example if these components are made of doped silicon they become conductive. In this way, by applying a voltage to an electrode (for example electrode 84 of FIG. 4A) the mirror behaves as the second electrode without the need to deposit a second designated electrode.

Figure 4B:
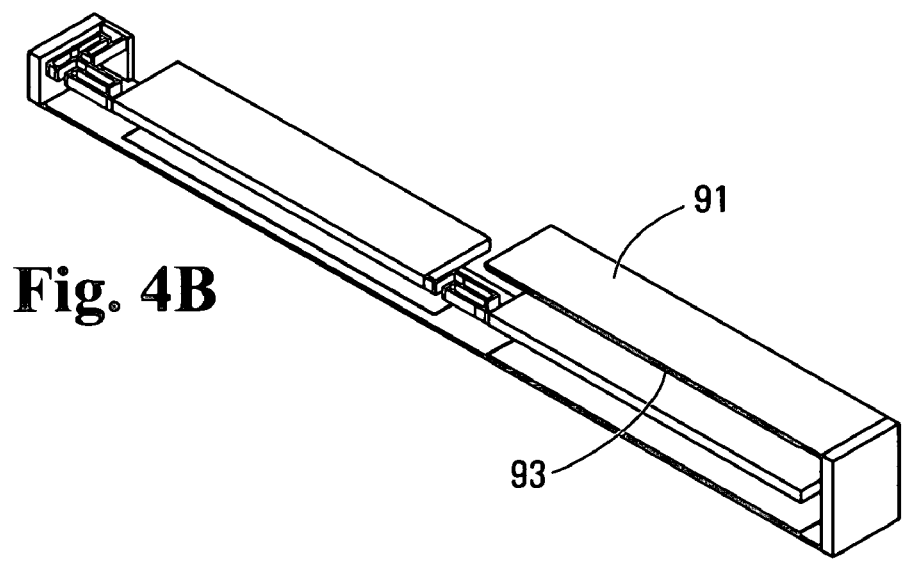

In some embodiments, in order to provide the most flexible control over the rotation over the additional rotational axis (θz), an additional support structure is provided on top of the cantilever 80 with an additional electrode so that a force could be applied to cause the end of 87 of the cantilever 80 to move upwards. However, in some applications, this additional degree of freedom may not be required. An example of this is shown in FIG. 4B (and the side view in FIG. 4C) which is very similar to FIG. 4A, with the exception of the additional support structure 91 and additional electrode 93 which allow an electrostatic force to be applied to the cantilever structure to move it both up and down. Note the view of FIG. 4B only shows half of the structure.

The embodiment of FIG. 4A has employed the use of electrodes through which electrostatic forces can be applied to control rotation in the two rotational axes. More generally, any other type of force could also be employed in either or both of these rotational axes. For example thermal, magnetic, thermal bimorph or piezo-electric forces can be employed to achieve the required rotation and control.

This combination of the 2D rotational articulated hinge, an articulated torsional mirror, and a moving cantilever results in a fully functional 2-D MEMS mirror. The cantilever can be deflected in either up or down directions depending on the arrangement of electrodes or force application, thus making the torsional mirror rotate about the second axis θz in either direction. For most electrostatic applications, the cantilever can be deflected downwards only to reduce the number of I/O's and control complexity.

Figure 5:
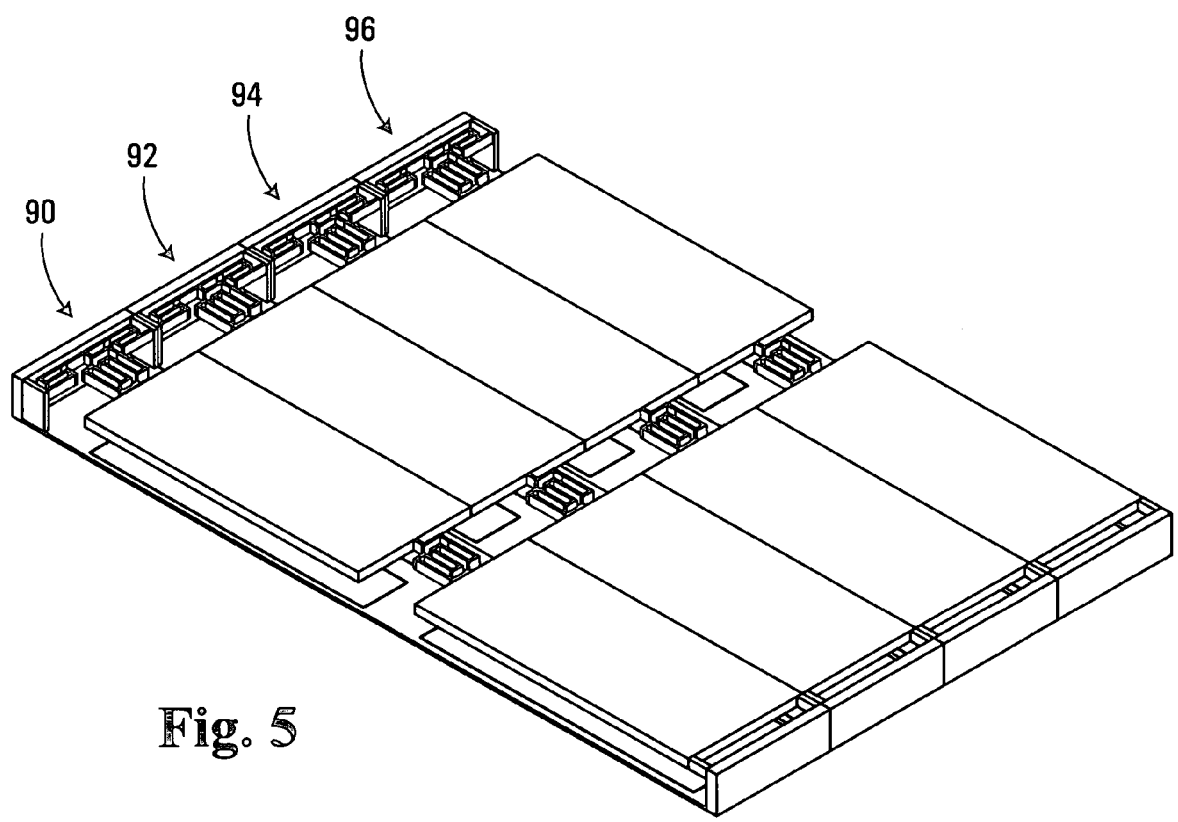
FIG. 5 is a one dimensional MEMS array of devices like the device of FIG. 4A.
Figure 6:
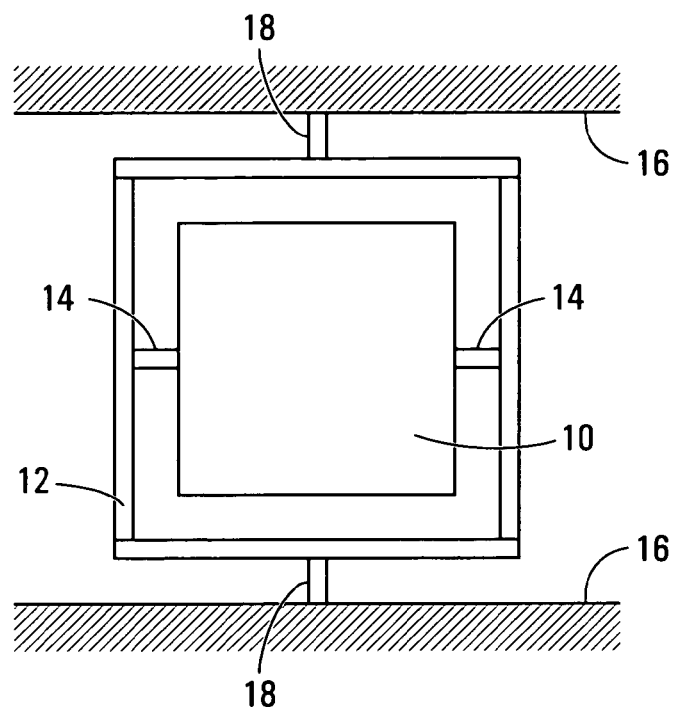
FIG. 6 is a view of a conventional two dimensional gimbal mirror with a supporting frame.
Figure 7:
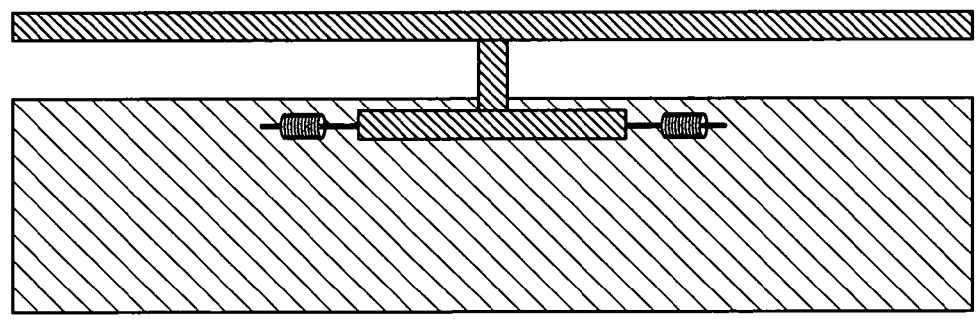
FIG. 7 is a representative sketch of a MEMS mirror with a hidden hinge structure.
Figure 8:
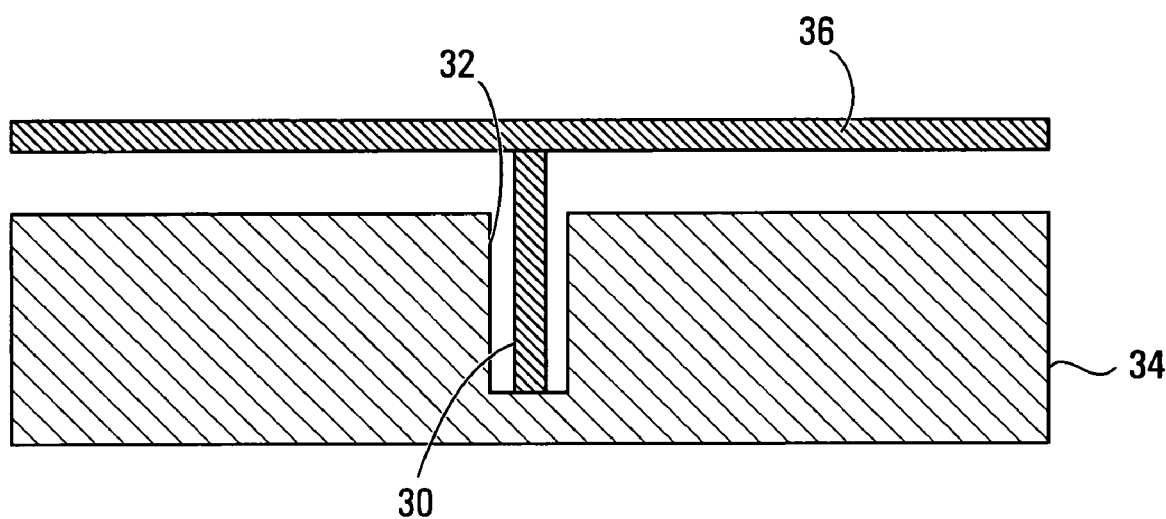
FIG. 8 is a representative sketch of a 2D mirror mounted on a single moving flexible post.

A number of mirrors can be placed side by side to make a linear mirror array with minimal spacing between two mirrors. An example of this is shown in FIG. 5 where a linear array of four 2D torsional mirrors 90,92,94,96 with 2D rotational articulated hinges and cantilevers is shown. An arbitrary number could be included in such an array. Another embodiment provides a two dimensional array of N×M such mirror devices.

One of the main advantages of the structure of FIG. 4A is the minimal coupling between the two tilt axes. This device structure can be used in any number of applications. It can be used as a single mirror for any appropriate application of a single or multi-array configuration. The arrangement achieves a high fill factor for mirror arrays (that is the spacing between two consecutive mirrors in an array is minimized) and is very simple to fabricate. The spacing between two mirrors can be as low as few microns or as limited by microfabrication processes.

Another embodiment of the invention will now be described with reference to FIG. 4D. This embodiment is very similar to that of FIG. 4A. This embodiment includes an additional cantilever 97 mounted over further support structure 98 to which an additional electrode 99 is affixed. Cantilever structures 80 and 97 together pivot about mounting points to the support structure 76. In operation, with this arrangement an electrostatic force can be applied between the electrode 87 and cantilever 80 to move point 87 in a downward direction. Similarly, an electrostatic force can be applied between electrode 99 and the underside of cantilever 97 to cause the end 87 of cantilever 80 to move upwards. Thus, the arrangement of FIG. 4D provides the same flexibility as the arrangement of FIG. 4B provided earlier in that both upwards and downwards mobility in the second axis of rotation (θz) is possible. The attachment of the cantilever structure composed of combined elements 80 and 97 to the support structure can either be pivotable, or rigid. In the event of a rigid connection, the support structure 76 would need to have some flexibility to allow the upwards and downwards motion of the two cantilever portions on either side of support structure 76.

In another embodiment, the arrangement of FIG. 4D is implemented with a balanced cantilever structure. With this embodiment, the moments of inertia on either side of the support structure 76 are substantially equalized. In one embodiment, this is achieved by making the second cantilever portion 97 substantially longer than the cantilever portion 80 such that the moments of inertia of the second cantilever portion 97 about the support structure 76 offsets the moment of inertia of the components on the other side of the support structure.

The device can be fabricated with existing MEMS fabrication processes. A few of the suitable processes that are commercially available are "Optical IMEMS"[R] from Analog Devices Inc (see Thor Juneau, et al, 2003, 'Single-Chip 1×84 MEMS Mirror Array For Optical Telecommunication Applications', Proceeding of SPIE, MOEMS and Miniaturized Systems III, 27–29 January 2003, Vol. 4983, pp. 53–64.), SOI MUMPS (http://www.memsrus.com/figs/soi-mumps.pdf) from Cronos (MEMScAP subsidiary). A custom process can also be put together to fabricate the device.

It is to be understood that in a system application, a control system would be provided to control the rotation of the mirror in the two degrees of freedom. This would be controlled through the proper application of the forces through the various electrodes. The control system will preferably be an open loop system with a voltage look-up table for various tilt position or a closed loop system with capacitance or optical sensing.

The mirrors in the above employed embodiments need to have a reflective coating, for example of Au, Al, or Cu in one of more layers. The mirrors are used to perform the main switching of beams of light. However, it is to be understood that the cantilever portion could also have a reflective coating. The cantilever and/or mirror components could be used for capacitive or optical sensing. For example, the mirror components might be used for switching, while the cantilever components are used to perform sensing with signals generated to perform feedback control over the orientation of the mirrors in the additional rotational axis (θz).

Numerous modifications and variations of the present invention are possible in light of the above teachings. It is therefore to be understood that within the scope of the appended claims, the invention may be practiced otherwise than as specifically described herein.

We claim:

1. A micro-electro-mechanical-system (MEMS) mirror device, comprising:
    a mirror having a 2-dimensional rotational articulated hinge at a first end, and having a 1-dimensional rotational articulated hinge at a second end opposite the first end;
    a movable cantilever connected to the mirror through the 1-dimensional rotational articulated hinge;
    a support structure connected to the mirror through the 2-dimensional rotational articulated hinge and connected to the movable cantilever;
    whereby movement of said movable cantilever causes rotation of the mirror in a first axis of rotation, and the mirror is also rotatable about a second torsional axis of rotation perpendicular to said first axis of rotation.

2. A device according to claim 1 wherein the 2-dimensional rotational articulated hinge comprises:
    a first 1-dimensional rotational articulated hinge having a first mounting point at a first end and having a second end;
    a second 1-dimensional rotational articulated hinge having a second mounting point at a first end and having a second end, the second end of the first 1-dimensional rotational articulated hinge being connected to the second end of the second 1-dimensional rotational articulated hinge;
    a third 1-dimensional rotational articulated hinge connected to the second ends of the first and second articulated 1-dimensional rotational hinges;
    whereby the first 1-dimensional rotational articulated hinge and the second 1-dimensional rotational articulated hinge define the first axis of rotation between the first and second mounting points, and the third 1-dimensional rotational articulated hinge and the 1-dimensional rotational articulated hinge at the second end of the mirror define the second torsional axis of rotation perpendicular to the first axis of rotation.

3. A device according to claim 2 wherein each 1-dimensional rotational articulated hinge comprises a respective articulated beam having a large thickness to width aspect ratio.

4. A device according to claim 3 wherein the beams are formed of a unitary construction.

5. A device according to claim 3 wherein the beams the mirror, and the movable cantilever are formed of a unitary construction.

6. A device according to claim 2 wherein each 1-dimensional rotational articulated hinge comprises a respective articulated beam having a large thickness to width aspect ratio, the beam being formed of a material or materials selected from a group consisting of silicon, polysilicon, Silicon Nitride, Silicon dioxide, and metallic depositable materials.

7. A device according to claim 1 in which the mirror has an angular range of motion at least 0.3 degrees in each axes.

8. A device according to claim 1 further comprising electrodes for applying electrostatic force to the mirror so as to move the mirror in the first and second axes of rotation.

9. A device according to claim 8 wherein the electrodes comprise two electrodes each for applying a respective electrostatic force to the mirror so as to move the mirror in a respective direction in the second axis of rotation, and at least one electrode for applying electrostatic force to the movable cantilever so as to move the mirror in the first rotational axis.

10. A device according to claim 9 wherein said at least one electrode comprises two electrodes mounted on the support structure each for applying a respective electrostatic force to the moving cantilever so as to move the mirror in a respective direction in the first rotational axis.

11. A device according to claim 10 wherein said support structure comprises a first region on a first side of the movable cantilever to which is mounted a first of said two electrodes for applying electrostatic force to the movable cantilever, and a second region opposite the moving cantilever to the first region to which is mounted a second of said two electrodes for applying electrostatic force to the movable cantilever.

12. A device according to claim 1 further comprising:
    a rigid extension of the movable cantilever extending beyond where the support structure is connected to the movable cantilever in a direction opposite to the mirror;
    whereby movement of the extension of the movable cantilever causes a corresponding opposite movement of the movable cantilever.

13. A device according to claim 12 comprising a first electrode for applying electrostatic force to the mirror so as to move the mirror in a first direction in the first axis of rotation, and a second electrode for applying electrostatic force to the mirror so as to move the mirror in a second direction in the first axis of rotation.

14. A device according to claim 13 wherein the first electrode for applying electrostatic force to the mirror so as to move the mirror in a first direction in the first axis of rotation is on the support structure proximal the moving cantilever, and the second electrode for applying electrostatic force to the mirror so as to move the mirror in a second direction in the first axis of rotation is on the support structure proximal the extension of the moving cantilever.

15. A device according to claim 12 wherein the moving cantilever and the rigid extension of the moving cantilever are together pivotably mounted to the support structure.

16. A device according to claim 12 wherein the moving cantilever and the rigid extension of the moving cantilever are together rigidly mounted to a portion of the support structure which is sufficiently flexible to allow the moving cantilever and the rigid extension of the moving cantilever to rotate in the first axis of rotation.

17. A device according to claim 12 wherein moments of inertia of the rigid extension of the moving cantilever substantially balance moments of inertia of the moving cantilever and mirror.

18. A device according to claim 1 in which the mirror is made of silicon plated with a metal.

19. A device according to claim 18 wherein the metal comprises Au, Al or Cu layers.

20. A plurality N of devices according to claim 1 arranged side by side to form a 1×N MEMs array, where N≧2.

21. A plurality N×M of devices according to claim 1 arranged in N rows of M devices thereby forming an N×M MEMs array, where N≧2 and M≧2.

22. A device according to claim 1 wherein the mirror is used for optical switching.

23. A device according to claim 1 wherein the movable cantilever is used for capacitive, magnetic or optical sensing of mirror position.

24. An optical switch comprising:
a plurality of optical ports;
a plurality of devices according to claim 1 each adapted to switch light between a respective pair of said optical ports.

25. A 2-dimensional rotational articulated hinge for connection to a support structure and a device to be rotated, the hinge comprising:
a first 1-dimensional rotational articulated hinge having a first mounting point at a first end for connection to the support structure and having a second end;
a second 1-dimensional rotational articulated hinge having a second mounting point at a first end for connection to the support structure and having a second end, the second end of the first 1-dimensional rotational articulated hinge being connected to the second end of the second 1-dimensional rotational articulated hinge;
a third 1-dimensional rotational articulated hinge having a first end connected to the second ends of the first and second articulated 1-dimensional rotational hinges and having a second end for connection to the device to be rotated;
whereby the first 1-dimensional rotational articulated hinge and the second 1-dimensional rotational articulated hinge define a first axis of rotation between the first and second mounting points, and the third 1-dimensional rotational articulated hinge defines a second torsional axis of rotation perpendicular to the first axis of rotation between the first end and second end of the third 1-dimensional rotational articulated hinge.

26. A 2-dimensional articulated hinge according to claim 25 wherein each 1-dimensional rotational articulated hinge comprises a respective articulated beam having a high thickness to width aspect ratio.

27. A 2-dimensional articulated hinge according to claim 25 wherein the beams are formed of a unitary construction.

28. A 2-dimensional articulated hinge according to claim 25 wherein the beams are formed of a material or materials selected from a group consisting of silicon, polysilicon, Silicon Nitride, Silicon dioxide, and Metallic depositable materials.

29. The 2-dimensional articulated hinge of claim 25 wherein other than the two connections to the support structure and the connection to the device to be rotated, the 2-dimensional articulated hinge has no other points of attachment to the support structure or the device to be rotated.

* * * * *